United States Patent
Brosnan et al.

(10) Patent No.: US 12,157,834 B2
(45) Date of Patent: Dec. 3, 2024

(54) COMPOSITION AND METHOD FOR POLYSILICON CMP

(71) Applicant: Cabot Microelectronics Corporation, Aurora, IL (US)

(72) Inventors: Sarah Brosnan, St. Charles, IL (US); Brian Reiss, Woodridge, IL (US)

(73) Assignee: CMC Materials LLC, Aurora, IL (US)

( * ) Notice: Subject to any disclaimer, the term of this patent is extended or adjusted under 35 U.S.C. 154(b) by 0 days.

(21) Appl. No.: 17/009,961

(22) Filed: Sep. 2, 2020

(65) Prior Publication Data
US 2021/0062043 A1 Mar. 4, 2021

Related U.S. Application Data

(60) Provisional application No. 62/895,838, filed on Sep. 4, 2019.

(51) Int. Cl.
| | | |
|---|---|---|
| C09G 1/02 | (2006.01) | |
| B24B 1/00 | (2006.01) | |
| B24B 37/04 | (2012.01) | |
| C09G 1/00 | (2006.01) | |
| C09G 1/04 | (2006.01) | |
| C09G 1/06 | (2006.01) | |
| C09K 3/14 | (2006.01) | |
| H01L 21/306 | (2006.01) | |
| H01L 21/321 | (2006.01) | |

(52) U.S. Cl.
CPC .............. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,702,954 B1 | 3/2004 | Her et al. | |
| 2008/0119051 A1* | 5/2008 | Babu | B81C 1/00611 |
| | | | 438/693 |
| 2009/0289217 A1* | 11/2009 | Sato | C23F 11/149 |
| | | | 252/79.4 |
| 2012/0190199 A1 | 7/2012 | Reiss | |
| 2013/0045599 A1* | 2/2013 | Ye | H01L 21/7684 |
| | | | 438/693 |
| 2018/0282580 A1* | 10/2018 | Leonov | C23F 1/10 |

FOREIGN PATENT DOCUMENTS

| | | | |
|---|---|---|---|
| CN | 102766406 A | 11/2012 | |
| CN | 102950537 A | 3/2013 | |
| CN | 104371550 A | 2/2015 | |
| JP | 2011205096 A | 10/2011 | |
| JP | 2017182858 | * 10/2017 | ............. B24B 37/00 |
| KR | 1020120077911 A | 7/2012 | |
| WO | 2012091330 A2 | 7/2012 | |

OTHER PUBLICATIONS

Korean Intellectual Property Office, International Search Report and Written Opinion of the International Searching Authority issued in connection with PCT/US2020/048990 on Dec. 14, 2020.
Dandu et al., Role of amines and amino acids in enhancing the removal rates of undoped and P-doped polysilicon films during chemical mechanical polishing, Colloids and Surfaces A: Physicochem. Eng. Aspects 366 (2010) 68-73.
Taiwan Intellectual Property Office, Search Report issued in connection with Taiwan Patent Application No. 109129988 on May 17, 2021.

* cited by examiner

*Primary Examiner* — Jiong-Ping Lu

(57) ABSTRACT

A chemical mechanical polishing composition for polishing a substrate having a polysilicon layer includes a water based liquid carrier, a silica abrasive, an amino acid or guanidine derivative containing polysilicon polishing accelerator, and an alkali metal salt. The composition includes less than about 500 ppm tetraalkylammonium salt and has a pH in a range from about 10 to about 11.

8 Claims, No Drawings

COMPOSITION AND METHOD FOR POLYSILICON CMP

BACKGROUND OF THE INVENTION

Chemical mechanical polishing is a key enabling technology in integrated circuit (IC) and micro-electro-mechanical systems (MEMS) fabrication. CMP compositions and methods for polishing (or planarizing) the surface of a substrate (such as a wafer) are well known in the art. Polishing compositions (also known as polishing slurries, CMP slurries, and CMP compositions) commonly include abrasive particles suspended (dispersed) in an aqueous solution and chemical additives such as accelerators for increasing the rate material removal during a CMP operation.

Polycrystalline silicon (also referred to in the art as polysilicon, poly-Si, or poly) films are widely used in IC and MEMS devices. For example, polysilicon has been long used as a gate electrode material in metal oxide semiconductor (MOS) and metal oxide semiconductor field-effect transistor (MOSFET) devices. Polysilicon is also commonly used in various damascene/interconnect applications in IC devices as well as in structural components in MEMS devices.

Commercially available polysilicon CMP slurries commonly include a tetramethylammonium hydroxide (TMAH) chemical accelerator that increases the rate of polysilicon removal. While such slurries are known to provide adequate polysilicon removal rates and may otherwise be serviceable, TMAH is a known hazardous and toxic chemical compound, having a Hazardous Materials Identification System (HIMS) rating of 300. TMAH can cause burns upon skin contact and is toxic to aquatic life. Therefore, there is a real need in the art for a polysilicon CMP composition that is substantially free of TMAH and other tetraalkylammonium compounds and also provides high polysilicon removal rates and high selectivity to silicon oxide and silicon nitride layers.

BRIEF SUMMARY OF THE INVENTION

A chemical mechanical polishing composition for polishing a substrate having a polysilicon layer is disclosed. In one embodiment, the polishing composition comprises, consists of, or consists essentially of a water based liquid carrier, about 0.1 to about 3 weight percent silica abrasive particles dispersed in the liquid carrier, about 0.05 to about 1 weight percent of a polysilicon accelerator, the polysilicon accelerator selected from the group consisting of an amino acid, a guanidine derivative, and mixtures thereof, and an alkali metal salt. The composition comprises less than about 500 ppm by weight tetraalkylammonium salts and has a pH in a range from about 10 to about 11.

DETAILED DESCRIPTION OF THE INVENTION

A chemical mechanical polishing composition for polishing a substrate having a polysilicon layer is disclosed. The polishing composition comprises, consists of, or consists essentially of a water based liquid carrier, a silica abrasive, a nitrogen containing polysilicon polishing accelerator, and an alkali metal salt. The pH of the composition is in a range from about 10 to about 11. In one example embodiment, the composition is substantially free of tetraalkylammonium salts such as tetramethylammonium salts, tetraethylammonium salts, and tetrabutylammonium salts.

The disclosed polishing compositions and corresponding (CMP methods) may confer significant and unexpected advantages. For example, the disclosed polishing compositions provide same high polysilicon polishing removal rates as well as high removal rate selectivities to both silicon oxide (e.g., TEOS) and silicon nitride. Moreover, the disclosed polishing compositions may be substantially free of tetraalkylammonium compounds such as TMAH and therefore tend to have lower environmental impact and reduced human health hazards.

The polishing composition contains an abrasive including silicon dioxide (silica) particles suspended in an aqueous liquid carrier. The abrasive may include substantially any suitable silica particles, for example, including colloidal silica particles and/or fumed silica particles. As used herein the term colloidal silica particles refers to silica particles that are prepared via a wet process rather than a pyrogenic or flame hydrolysis process which commonly produces structurally different particles. Such colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained from any of a number of commercial suppliers, for example, including EKA Chemicals, Fuso Chemical Company, Nalco, DuPont, Bayer, Applied Research, Nissan Chemical, and Clariant.

Pyrogenic silica (also referred to as fumed silica) is produced via a flame hydrolysis process in which a suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three dimensional chain-like aggregates. Fumed silica abrasives are commercially available from a number of suppliers including, for example, Cabot Corporation, Evonic, and Wacker Chemie.

The silica abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, Louisiana) or the Zetasizer® available from Malvern Instruments®. Such instruments generally report an average particle size for a silica dispersion.

The silica abrasive particles may have an average particle size of about 10 nm or more (e.g., about 20 nm or more, about 25 nm or more, or about 30 nm or more). The abrasive particles may have an average particle size of about 200 nm or less (e.g., about 180 nm or less, about 160 nm or less, about 140 nm or less, or about 120 nm or less). It will thus be understood that the abrasive particles may have an average particle size in a range bounded by any two of the aforementioned endpoints. For example, the abrasive particles may have an average particle size in a range from about 10 nm to about 200 nm (e.g., from about 20 nm to about 200 nm, from about 25 nm to about 180 nm, from about 25 nm to about 160 nm, from about 30 nm to about 140 nm, or from about 30 nm to about 120 nm).

It will be appreciated that the silica abrasive particles are dispersed and suspended in the polishing composition (i.e., in the aqueous liquid carrier). When the silica particles are suspended in the polishing composition, the silica particles are preferably colloidally stable. By colloidally stable it is meant that the silica particles remain suspended in the composition over time. In the context of this invention, silica abrasive particles are considered colloidally stable if, when placed into a 100 mL graduated cylinder and allowed to stand unagitated for a time of 2 hours, the difference between the concentration of particles in the bottom 50 mL of the graduated cylinder (B in terms of g/mL) and the concentration of particles in the top 50 mL of the graduated cylinder (T in terms of g/ml) divided by the initial concentration of particles in the abrasive composition (C in terms of g/mL) is less than or equal to 0.5 (i.e., $(B-T)/C \leq 0.5$). More preferably, the value of $(B-T)/C$ is less than or equal to 0.3, and most preferably is less than or equal to 0.1.

The polishing composition may include substantially any suitable amount of the silica abrasive particles. If the polishing composition comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition may include about 0.05 wt. % or more (e.g., about 0.1 wt. % or more, about 0.15 wt. % or more, about 0.2 wt. % or more, or about 0.25 wt. % or more) silica abrasive particles. The concentration of abrasive particles in the polishing composition is generally less than about 5 wt. %, and more typically about 3 wt. % or less (e.g., about 2 wt. % or less, about 1.5 wt. % or less, about 1.2 wt. % or less, or about 1 wt. % or less). It will be understood that the abrasive particles may be present in the polishing composition at a concentration bounded by any two of the aforementioned endpoints. For example, the concentration of abrasive particles in the polishing composition may be in a range from about 0.05 wt. % to about 5 wt. %, and more preferably from about 0.1 wt. % to about 3 wt. % (e.g., from about 0.1 wt. % to about 1.5 wt. %, from about 0.2 wt. % to about 1.5 wt. %, from about 0.2 wt. % to about 1.2 wt. %, from about 0.2 wt. % to about 1 wt. %, or from about 0.25 wt. % to about 1 wt. %).

An aqueous liquid carrier is used to facilitate the application of the abrasive and any optional chemical additives to the surface of the substrate to be polished (e.g., planarized). By aqueous it is meant that the liquid carrier is made up of at least 50 wt. % water (e.g., deionized water). The liquid carrier may include other suitable non-aqueous carriers, for example, including lower alcohols (e.g., methanol, ethanol, etc.) and ethers (e.g., dioxane, tetrahydrofuran, etc.). Preferably, the liquid carrier consists essentially of or consists of water, and more preferably deionized water.

The polishing composition is generally alkaline having a pH of greater than about 7. The polishing composition may have a pH of about 8 or more (e.g., about 9 or more or about 10 or more). Moreover, the polishing composition may have a pH of about 13 or less (e.g., about 12 or less or about 11 or less). It will be understood that the polishing composition may have a pH in a range bounded by any two of the aforementioned endpoints, for example, in a range from about 9 to about 12 (e.g., from about 10 to about 11). For example, the pH of the composition may be about 10.5.

The polishing composition preferably includes and alkali metal hydroxide such as potassium hydroxide in an amount suitable to adjust the pH to the desired level. The amount of alkali metal hydroxide required to adjust the pH may depend on many factors, for example, including the selected pH of the polishing composition, the amount and type of optional chemical additives, and various attributes of the selected silica abrasive particles. In certain embodiments, the polishing composition may include, for example, from about 0.01 wt. % to about 0.4 wt. % (e.g., from about 0.02 to about 0.2 wt. %) potassium hydroxide.

The polishing composition further includes a nitrogen containing polysilicon polishing accelerator. The nitrogen containing polishing accelerator may include amino acids and guanidine derivatives. While not wishing to be bound by theory, it is believed that suitable amino acid and guanidine derivatives activate or oxidize the polysilicon surface thereby promoting rapid removal during chemical mechanical polishing. Suitable amino acids may include arginine, cysteine, glycine, histidine, lysine, methylglycine, trimethylglycine (betaine), or mixtures thereof. Suitable guanidine derivatives may include arginine, creatine, a guanidine salt, or mixtures thereof. In preferred embodiments, the polysilicon accelerator includes arginine, betaine (trymethylglycine), guanidine carbonate, or mixtures thereof. In one preferred embodiment the polysilicon polishing accelerator includes arginine.

The polysilicon accelerator may be present in the polishing composition in substantially any suitable amount. For example, the concentration of the polysilicon polishing accelerator in the polishing composition may be 0.01 wt. % or more (e.g., 0.02 wt. % or more, 0.04 wt. % or more, 0.06 wt. % or more, 0.08 wt. % or more, or 0.1 wt. % or more) of the polysilicon accelerator. The concentration of polysilicon polishing accelerator may be less than about 1 wt. % (e.g., 0.8 wt. % or less, 0.6 wt. % or less, 0.5 wt. % or less, or 0.4 wt. % or less). It will be understood that the abrasive particles may be present in the polishing composition at a concentration bounded by any two of the aforementioned endpoints. For example, the concentration of the polysilicon polishing accelerator in the polishing composition may be in a range from about 0.01 wt. % to about 1 wt. % (e.g., from about 0.02 wt. % to about 1 wt. %, from about 0.02 wt. % to about 0.8 wt. %, from about 0.04 wt. % to about 0.8 wt. %, from about 0.04 wt. % to about 0.6 wt. %, from about 0.06 wt. % to about 0.6 wt. %, from about 0.08 wt. % to about 0.5 wt. %, or from about 0.1 wt. % to about 0.4 wt. %). In one example embodiment the polishing composition comprises from about 0.05 wt. % to about 0.5 wt. % of the polysilicon polishing accelerator.

The polishing composition may further include other optional additives, for example including, secondary polysilicon accelerators, chelating agents, stabilizers, and biocides. Such additives are purely optional. The disclosed embodiments are not so limited and do require the use of any one or more of such additives.

In certain embodiments the polishing composition may include one or more of the following optional additives: (i) a potassium salt polysilicon accelerator, (ii) an amino phosphonic acid silica chelator, (iii) a heterocyclic amine polysilicon accelerator, and (iv) a hydroxy acid polysilicon accelerator. For example, the polishing composition may include a potassium salt polysilicon accelerator. While not wishing to be bound by theory, it is believed that a potassium salt may function to adjust the conductivity of the composition and thereby promote polysilicon activation. The potassium salt may include substantially any suitable potassium salt, for example, including potassium chloride, potassium bromide, potassium iodide, potassium bicarbonate, and mixtures thereof.

In optional embodiments including potassium salt(s), the polishing composition may include from about 0.01 wt. % or more (e.g., about 0.02 wt. % or more, about 0.03 wt. % or more, about 0.04 wt. % or more, or about 0.05 wt. % or more) potassium salt. In such optional embodiments, the polishing composition may include about 1 wt. % or less (e.g., about 0.8 wt. % or less, about 0.6 wt. % or less, about 0.4 wt. % or less, or about 0.2 wt. % or less) potassium salt. It will be understood that a potassium salt may optionally be present in the polishing composition at a concentration bounded by any two of the aforementioned endpoints. For example, the concentration of the potassium salt in the optional embodiments may be in a range from about 0.01 wt. % to about 1 wt. % (e.g., from about 0.02 wt. % to about 0.8 wt. %, from about 0.02 wt. % to about 0.6 wt. %, from about 0.04 wt. % to about 0.4 wt. %, or from about 0.5 wt. % to about 0.2 wt. %). In one example embodiment, the polishing composition includes from about 0.03 wt. % to about 0.3 wt. % potassium bicarbonate.

The polishing composition may optionally include an aminophosphonic acid silica chelator. Not wishing to be bound by a particular theory, the aminophosphonic acid is believed to act as a silica chelator and thereby increase the polysilicon polishing rate in certain compositions. The silica chelator may include substantially any suitable aminophosphonic acid, for example, including ethylenediaminetetra (methylene phosphonic acid), amino tri(methylene phosphonic acid), diethylenetriaminepenta(methylene phosphonic acid), salts thereof, and combinations thereof. A preferred aminophosphonic acid is amino tri(methylene phosphonic acid), An illustrative aminophosphonic acid is DEQUEST™ 2000 EG available commercially from ThermPhos International.

In optional embodiments including an aminophosphonic acid, the polishing composition may include from about 0.002 wt. % or more (e.g., about 0.004 wt. % or more, about 0.006 wt. % or more, about 0.008 wt. % or more, or about 0.01 wt. % or more) aminophosphonic acid. In such optional embodiments, the polishing composition may include about 0.5 wt. % or less (e.g., about 0.2 wt. % or less, about 0.15 wt. % or less, about 0.1 wt. % or less, about 0.08 wt. % or less, or about 0.06 wt. % or less) aminophosphonic acid. It will be understood that an aminophosphonic acid may optionally be present in the polishing composition at a concentration bounded by any two of the aforementioned endpoints. For example, the concentration of the aminophosphonic acid in the optional embodiments may be in a range from about 0.002 wt. % to about 0.5 wt. % (e.g., from about 0.002 wt. % to about 0.2 wt. %, from about 0.006 wt. % to about 0.15 wt. %, from about 0.006 wt. % to about 0.1 wt. %, or from about 0.01 wt. % to about 0.1 wt. %).

The polishing composition may optionally include a heterocyclic amine secondary polysilicon accelerator and/or a hydroxy acid secondary polysilicon accelerator. The heterocyclic amine may include a heterocyclic aromatic amine or a heterocyclic aliphatic amines. A preferred heterocyclic aromatic amine is 1,2,4-triazole. A preferred heterocyclic aliphatic amine is aminoethylpiperazine. The hydroxyl acid may include, for example, glycolic acid, lactic acid, malic acid, citric acid, and/or tartaric acid. Citric acid and lactic acid are preferred hydroxyl acids.

In optional embodiments including a secondary polysilicon accelerator, the polishing composition may include from about 0.002 wt. % or more (e.g., about 0.004 wt. % or more, about 0.006 wt. % or more, about 0.008 wt. % or more, or about 0.01 wt. % or more) secondary polysilicon accelerator. In such optional embodiments, the polishing composition may include about 0.5 wt. % or less (e.g., about 0.2 wt. % or less, about 0.15 wt. % or less, about 0.1 wt. % or less, about 0.08 wt. % or less, or about 0.06 wt. % or less) secondary polysilicon accelerator. It will be understood that a secondary polysilicon accelerator may optionally be present in the polishing composition at a concentration bounded by any two of the aforementioned endpoints. For example, the concentration of the secondary polysilicon accelerator in the optional embodiments may be in a range from about 0.002 wt. % to about 0.5 wt. % (e.g., from about 0.002 wt. % to about 0.2 wt. %, from about 0.006 wt. % to about 0.15 wt. %, from about 0.006 wt. % to about 0.1 wt. %, or from about 0.01 wt. % to about 0.1 wt. %).

The polishing composition may optionally further include a biocide. The biocide may include substantially any suitable biocide, for example an isothiazolinone biocide such as a methylisothiazolinone or a benzisothiazolone. The amount of biocide in the polishing composition typically is in a range from about 1 ppm to about 50 ppm, and preferably from about 1 ppm to about 20 ppm.

The polishing composition is preferably substantially free of tetraalkylammonium salts, for example, including tetramethylammonium salts, tetraethylammonium salts, tetrapropylammonium salts, tetrabutylammonium salts, cetyltrimethyl ammonium salts, and the like. Such salts include, for example, tetraalkylammonium hydroxides, chlorides, bromides, and the like. In preferred embodiments, the polishing composition being substantially free of tetraalkylammonium salts means that no tetraalkylammonium salts are intentionally added to the polishing composition such that the intended concentration of tetraalkylammonium salts essentially zero. However, the disclosed embodiments are not so severely limited. More generally, by substantially free of it is meant that the polishing composition includes less than 1000 ppm by weight (0.1 wt. %) (e.g., less than 500 ppm, less than 200 ppm, less than 100 ppm, less than 20 ppm, less than 10 ppm, less than 5 ppm, less than 1 ppm, less than 0.5 ppm, or less than 0.1 ppm) tetraalkylammonium salts.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, polysilicon accelerator, and any optional additives).

It will be understood that any of the components of the polishing composition that are salts (e.g., the potassium salt, the alkali metal hydroxide, the aminophosphonic acid, etc.), when dissolved in the water of the polishing composition, can exist in dissociated form as cations and anions. The amounts of salts present in the polishing composition as recited herein will be understood to refer to the weight of the undissociated salt used in the preparation of the polishing composition. For example, the weight of an alkali metal hydroxide (e.g., potassium hydroxide), refers to the amount of the potassium salt as provided by its empirical formula (e.g., KOH).

In one example, the silica abrasive may be dispersed in the aqueous liquid carrier. Other components such as the polysilicon accelerator, and the optional additives may then be added and mixed by any method that is capable of incorporating the components into the polishing composition. For example, these components may be dissolved in water to obtain an aqueous solution (in any order or simultaneously). The silica dispersion may then be added to the aqueous solution (or alternatively the aqueous solution may be added to the silica dispersion) to obtain the polishing composition. The pH may be adjusted at any suitable time, for example, prior to or after combining the silica dispersion and the aqueous solution. In one embodiment, a predetermined quantity of KOH is added to the aqueous solution prior to combining with the silica dispersion. The pH is then checked to confirm that it falls within a predetermined range of values.

The polishing composition of the invention may be provided as a concentrate which is intended to be diluted with an appropriate amount of water prior to use. In such an embodiment, the polishing composition concentrate may include abrasive particles, polysilicon accelerator, and other optional additives described above in amounts such that, upon dilution of the concentrate with an appropriate amount of water each component of the polishing composition will be present in the polishing composition in an amount within the appropriate range recited above for each component. For example, the silica abrasive particles, the polysilicon accelerator, and other optional additives may each be present in the polishing composition in an amount that is about 3 times (e.g., about 4 times, about 5 times, about 6 times, about 7.5 times, about 10 times, about 15 times, about 20 times, about 25 times, about 30 times, or about 50 times) greater than the concentration recited above for each component so that, when the concentrate is diluted with an equal volume of (e.g., 2 equal volumes of water, 3 equal volumes of water, 4 equal volumes of water, 5 equal volumes of water, 5 equal volumes of water, 6.5 equal volumes of water, 9 equal volumes of water, 14 equal volumes of water, 19 equal volumes of water, 24 equal volumes of water, 29 equal volumes of water, or even about 49 equal volumes of water respectively), each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as a polysilicon layer) to polish the substrate.

Although the polishing composition of the invention may be used to polish any substrate, the polishing composition is particularly useful in the polishing of a substrate comprising silicon, and in particular, a polycrystalline silicon (polysilicon) layer. The polishing composition may be particularly advantageous in the polishing of a substrate further including silicon oxide, e.g., tetraethylorthosilicate (TEOS), and silicon nitride (SiN) layers. For example, the polishing composition may be advantageously used in CMP operations in which a high removal rate selectivities of polysilicon to silicon oxide and polysilicon to silicon nitride are desirable (i.e., in which the removal rate ratios of polysilicon to silicon oxide and polysilicon to silicon nitride are high). For example, when desirable, the polishing composition may be used to polish a substrate with a polysilicon to silicon oxide polishing selectivity of about 10:1 or higher (e.g., about 20:1 or higher, about 40:1 or higher, about 50:1 or higher, about 100:1 or higher, or about 150:1 or higher). Also, the chemical-mechanical polishing composition of the invention may be used to polish a substrate with a polysilicon to silicon nitride polishing selectivity of about 10:1 or higher (e.g., about 20:1 or higher, about 40:1 or higher, about 50:1 or higher, about 100:1 or higher, or about 150:1 or higher). Certain formulations in combination with certain CMP polishing parameters may exhibit even higher polysilicon to silicon oxide and polysilicon to silicon nitride polishing selectivities, such about 200:1 or higher.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

It will be understood that the disclosure includes numerous embodiments. These embodiments include, but are not limited to, the following embodiments.

In a first embodiment a chemical mechanical polishing composition for polishing a substrate containing a polysilicon layer is disclosed. The composition may include: a water based liquid carrier; about 0.1 to about 3 weight percent silica abrasive particles dispersed in the liquid carrier; about 0.05 to about 1 weight percent of a polysilicon accelerator, the polysilicon accelerator selected from the group consisting of an amino acid, a guanidine derivative, and mixtures thereof an alkali metal salt; wherein the composition has a pH in a range from about 10 to about 11; and wherein the composition comprises less than 500 ppm by weight tetraalkylammonium salts.

A second embodiment may include the first embodiment comprising from about 0.2 to about 1.5 weight percent of the silica abrasive particles.

A third embodiment may include any one of the first through second embodiments comprising from about 0.1 to about 0.5 weight percent of the polysilicon accelerator.

A fourth embodiment may include any one of the first through third embodiments, wherein the polysilicon accelerator is arginine, trimethylglycine, guanidine carbonate, or a mixture thereof.

A fifth embodiment may include any one of the first through third embodiments, wherein the polysilicon accelerator is a guanidine derivative.

A sixth embodiment may include any one of the first through fifth embodiments and may further comprise about 0.01 to about 0.5 weight percent of a heterocyclic amine.

A seventh embodiment may include the sixth embodiment, wherein the heterocyclic amine is a triazole compound.

An eighth embodiment may include any one of the first through seventh embodiments and may further comprise about 0.05 to about 0.5 weight percent of an amino phosphonic acid compound.

A ninth embodiment may include the eighth embodiment, wherein the amino phosphonic acid compound is amino tri methylene phosphonic acid.

A tenth embodiment may include any one of the first through ninth embodiments and may further comprise about 0.01 to about 1 weight percent of a potassium salt.

An eleventh embodiment may include any one of the first through ninth embodiments and may further comprise about 0.03 to about 0.3 weight percent of potassium bicarbonate.

A twelfth embodiment may include any one of the first through eleventh embodiments and may further comprise from 0.05 to about 0.5 weight percent amino tri methylene phosphonic acid, from about 0.03 to about 0.3 weight percent of potassium bicarbonate; and wherein the polysilicon accelerator is arginine.

A thirteenth embodiment may include any one of the first through twelfth embodiments, wherein the composition comprises less than about 10 ppm tetraalkylammonium salts.

A fourteenth embodiment discloses a method of chemical mechanical polishing a substrate including a polysilicon material. The method includes: (a) providing a polysilicon polishing composition comprising: a water based liquid carrier; about 0.1 to about 3 weight percent silica abrasive particles dispersed in the liquid carrier; about 0.05 to about 1 weight percent of a polysilicon accelerator, the polysilicon accelerator selected from the group consisting of an amino acid, a guanidine derivative, and mixtures thereof; an alkali metal salt; wherein the composition has a pH in a range from about 10 to about 11; and wherein the composition comprises less than 500 ppm by weight tetraalkylammonium salts; (b) contacting the substrate with the chemical mechanical polishing composition; (c) moving the polishing composition relative to the substrate; and (d) abrading the substrate to remove a portion of the silicon oxygen containing material from the substrate and thereby polish the substrate.

A fifteenth embodiment includes the fourteenth embodiment, wherein: the substrate further comprises a silicon oxide material and a silicon nitride material; a removal rate selectivity of the polysilicon material to the silicon oxide material is greater than about 50:1 in (d); and a removal rate selectivity of the polysilicon material to the silicon nitride material is greater than about 50:1 in (d).

A sixteenth embodiment may include any one of the fourteenth through fifteenth embodiments, wherein: the polishing composition comprises from about 0.2 to about 1.5 weight percent of the silica abrasive particles and from about 0.1 to about 0.5 weight percent of the polysilicon accelerator; the polysilicon accelerator is a guanidine derivative.

A seventeenth embodiment includes the sixteenth embodiment, wherein: the polishing composition further comprises from 0.05 to about 0.5 weight percent amino tri methylene phosphonic acid and from about 0.03 to about 0.3 weight percent of potassium bicarbonate; and wherein the polysilicon accelerator is arginine.

An eighteenth embodiment may include any one of the fourteenth through seventeenth embodiments, wherein the polishing composition comprises less than about 10 ppm tetraalkylammonium salts.

A nineteenth embodiment discloses a method of chemical mechanical polishing a substrate including a polysilicon material. The method includes: (a) providing a concentrated polysilicon polishing composition comprising: a water based liquid carrier; about 1 to about 15 weight percent silica abrasive particles dispersed in the liquid carrier; about 0.5 to about 10 weight percent of a polysilicon accelerator, the polysilicon accelerator selected from the group consisting of an amino acid, a guanidine derivative, and mixtures thereof; an alkali metal salt; and less than 0.1 weight percent tetraalkylammonium salt; (b) adding one part of the concentrated polishing composition to about 5 to about 30 parts water to obtain a point of use polishing composition having a pH in a range from about 10 to about 11; (c) moving the polishing composition relative to the substrate; and (d) abrading the substrate to remove a portion of the silicon oxygen containing material from the substrate and thereby polish the substrate.

A twentieth embodiment includes the nineteenth embodiment, wherein: the substrate further comprises a silicon oxide material and a silicon nitride material; a removal rate selectivity of the polysilicon material the silicon oxide material is greater than about 50:1; and a removal rate selectivity of the polysilicon material the silicon nitride material is greater than about 50:1.

The following examples further illustrate the invention but, of course, should not be construed as in any way limiting its scope. Polysilicon containing substrates were polished using either an Applied Materials Mirra® polishing tool or a Logitech benchtop polishing machine. Substrates were polished for 60 seconds on the Mirra® at a platen speed of 93 rpm, a head speed of 87 rpm, a downforce of 3 psi, and a slurry flow rate of 125 ml/min. The substrates were polished on IC1010 pad (available from Dow) using a 3M-A189L conditioner. Substrates were polished for 60 seconds on the Logitech at a platen speed of 100 rpm, a head speed of 85 rpm, a downforce of 3 psi, and a slurry flow rate of 45 ml/min. The substrates were polished on either IC1010 pad (available from Dow) or a D100 pad (available from Cabot Microelectronics) using a Saesol C7 conditioner.

Blanket polysilicon, TEOS, and/or SiN wafers were polished in the Examples that follow. The polysilicon wafers were obtained from Novarti and included a 10000 Å polysilicon layer. The TEOS wafers were obtained from Advantec and included a 15000 Å TEOS layer. The SiN wafers were also obtained from Advantec and included a 5000 Å PE-SiN layer.

Example 1

Three polishing compositions were evaluated on the Mirra® tool. A control composition included a TMAH polysilicon polishing accelerator. Compositions 1A and 1B are TMAH-free and included an L-arginine polysilicon polishing accelerator. The control composition was prepared as a 15× concentrate and included (a) 13.125 wt. % silica (Nalco DVSTS006 silica particles), (b) 2.63 wt. % TMAH, (c) 1.3 wt. % KHCO$_3$, (d) 0.79 wt. % KOH, (e) 0.39 wt. % DEQUEST® 2000EG, and (f) 0.33 wt. % 1,2,4-triazole in deionized water. One part of the control composition was mixed with 14 parts water prior to polishing to obtain a point of use control prior to polishing. The point of use (diluted) pH was about 10.5. Compositions 1A and 1B were also prepared as 15× concentrates and included (i) 13.125 wt. % silica (Nalco DVSTS006 silica particles), (ii) 5.03 wt. % L-arginine (1A) or 2.51 wt. % L-arginine (1B), (iii) 1.31 wt. % KHCO$_3$, (d) 0.79 wt. % KOH, (e) 0.39 wt. % aminotri (methylene phosphonic acid) (DEQUEST® 2000EG, and (f) 0.33 wt. % 1,2,4-triazole in deionized water. One part of each of compositions 1A and 1B was mixed with 14 parts water prior to polishing to obtain a point of use control prior to polishing. The point of use (diluted) pH was about 10.5. The molar concentration of L-arginine in polishing composition 1A was identical to the molar concentration of TMAH in the control (0.289 M).

Blanket polysilicon, TEOS, and SiN wafers were polished for 60 seconds on a Mirra® tool at the conditions listed above. Polishing results are shown in Table 1. All removal rates (RR) are listed in angstroms per minute (Å/min)

TABLE 1

|         | PolySi RR | TEOS RR | SiN RR | PolySi:TEOS | PolySi:SiN |
|---------|-----------|---------|--------|-------------|------------|
| Control | 5582      | 53      | 36     | 105         | 155        |
| 1A      | 5010      | 21      | 22     | 239         | 228        |
| 1B      | 4912      | 22      | 22     | 223         | 223        |

It is readily apparent from the results set forth in Table 1, that compositions 1A and 1B, utilizing an L-arginine polysilicon accelerator can achieve high polysilicon removal rates (nearly equivalent to the TMAH containing control). Moreover, compositions 1A and 1B achieved superior removal rate selectivity to TEOS and SiN.

Example 2

Nine polishing compositions were evaluated on the Logitech desktop polisher. The control composition was identical to the Example 1 control. Composition 1B was identical to the Example 1 composition 1B. Compositions 2A, 2B, 2C, 2D, 2E, 2F, and 2G included alternative polysilicon polishing accelerators but were otherwise identical to composition 1B. The alternative polysilicon polishing accelerators included L-lysine (2A), L-histidine (2B), guanidine carbonate (2C), glycine (2D), citric acid (2E), trimethylglycine (betaine) (2F), and cysteine (2G) at molar concentrations identical to the molar concentration of L-arginine in composition 1B (0.145 M).

Blanket polysilicon, TEOS wafers, and SiN wafers were polished for 60 seconds on a Logitech desktop polisher using a D100 pad at the conditions listed above. Polishing results are shown in Table 2. All removal rates (RR) are listed in angstroms per minute (Å/min).

TABLE 2

|         | PolySi RR | TEOS RR | SiN RR | PolySi:TEOS | PolySi:SiN |
|---------|-----------|---------|--------|-------------|------------|
| Control | 4409      | 105     | 56     | 42          | 79         |
| 1B      | 4025      | 58      | 16     | 69          | 252        |
| 2A      | 4567      | 28      | 14     | 163         | 326        |
| 2B      | 4037      | 21      | 16     | 192         | 252        |
| 2C      | 4860      | 59      | 32     | 82          | 152        |
| 2D      | 4272      | 38      | 21     | 112         | 203        |
| 2E      | 4409      | 43      | 22     | 103         | 200        |
| 2F      | 4067      | 42      | 21     | 97          | 194        |
| 2G      | 4304      | 23      | 13     | 187         | 331        |

As is readily apparent from the results set forth in Table 2, amino acid and guanidine derivative polysilicon polishing accelerators can achieve high polysilicon removal rates and superior removal rate selectivity to TEOS and SiN. Compositions 1B, 2C, and 2F were generally considered to be superior since silica particle growth was observed in the concentrate compositions for compositions 2A, 2B, 2D, 2E, and 2G.

Example 3

Eight polishing compositions were evaluated on the Logitech desktop polisher. The control composition was identical to the Example 1 control. Composition 1B was identical to the Example 1 composition 1B. Compositions 3A, 3B, 3C, 3D, 3E, and 3F were prepared to evaluate the role of silica concentration. Compositions 3A, 3B, and 3C included different silica concentrations but were otherwise identical to composition 1B. Composition 3A included 8.8 wt. % silica in the concentrate (a one-third reduction from composition 1B) and composition 3B included 4.4 wt. % silica in the concentrate (a two-thirds reduction from composition 1B). Composition 3C did not include any silica abrasive (0.0 wt. %). Composition 3D was deionized water (i.e., did not include any silica abrasive or any chemical additives). Compositions 3E and 3F did not include any silica abrasive, but included higher concentrations of L-arginine: 10 wt. % in the concentrate (4 times the concentration in composition 1B) (3E) and 15 wt. % in the concentrate (6 times the concentration in composition 1B) (3F).

Blanket polysilicon, TEOS wafers, and SiN wafers were polished for 60 seconds on a Logitech desktop polisher using a D100 pad at the conditions listed above. Polishing results are shown in Table 3. All removal rates (RR) are listed in angstroms per minute (Å/min).

TABLE 3

|         | PolySi RR | TEOS RR | SiN RR | PolySi:TEOS | PolySi:SiN |
|---------|-----------|---------|--------|-------------|------------|
| Control | 4486      | 50      | 28     | 90          | 160        |
| 1B      | 4068      | 21      | 23     | 194         | 177        |
| 3A      | 3922      | 36      | 16     | 109         | 245        |
| 3B      | 3502      | —       | 11     | —           | 318        |
| 3C      | 9         | 24      | —      | 0.4         | —          |
| 3D      | 8         | 2       | 3      | 4           | 3          |
| 3E      | 20        | —       | —      | —           | —          |
| 3F      | 18        | 2       | 1      | 9           | 18         |

As is evident in the data set forth in Table 3, high polysilicon removal rates can be achieved for polishing compositions having reduced silica concentrations. However, the removal rates were essentially zero for abrasive-free compositions (0 wt. % silica). The removal rates of such abrasive free compositions were essentially zero even when very concentrations of polysilicon polishing accelerator were used indicating that abrasive free compositions are not feasible.

Example 4

Five polishing compositions were evaluated on the Logitech desktop polisher to evaluate the effect of dilution. The control composition was identical to the Example 1 control. Composition 4A was identical to composition 1A in Example 1 with the exceptions that composition 4A was prepared as a 10× concentrate and included 0.0 wt. % 1,2,4 triazole such that the concentrate included (i) 8.75 wt. % silica (Nalco DVSTS006 silica particles), (ii) 3.35 wt. %

L-arginine, (iii) 0.87 wt. % KHCO₃, (d) 0.53 wt. % KOH, (e) 0.26 wt. % aminotri(methylene phosphonic acid) (DEQUEST® 2000EG, and (f) 0.0 wt. % 1,2,4-triazole in deionized water. Composition 4A was diluted with 9 parts water to 1 part concentrate prior to polishing as in Examples 1, 2, and 3. Compositions 4B, 4C, and 4D were identical to composition 4A but were diluted with 14 (4B), 24 (4C), and 34 (4D) parts water to 1 part concentrate prior to polishing.

Blanket polysilicon, TEOS wafers, and SiN wafers were polished for 60 seconds on a Logitech desktop polisher using an IC1010 pad at the conditions listed above. Polishing results are shown in Table 4. All removal rates (RR) are listed in angstroms per minute (Å/min).

TABLE 4

|  | PolySi RR | TEOS RR | SiN RR | PolySi:TEOS | PolySi:SiN |
| --- | --- | --- | --- | --- | --- |
| Control | 4239 | 99 | 29 | 43 | 146 |
| 4A | 3793 | 88 | 29 | 43 | 131 |
| 4B | 3638 | 27 | 11 | 135 | 331 |
| 4C | 3014 | 27 | 5 | 112 | 603 |
| 4D | 2532 | 15 | 5 | 169 | 506 |

As is evident in the data set forth in Table 4, polysilicon removal rate was observed to decrease monotonically with over-dilution (i.e., with decreasing point-of-use concentrations of silica abrasive and L-arginine). However, superior removal rate selectivity to TEOS and SiN was also observed for the over-diluted compositions (i.e., compositions including lower point-of-use concentrations of silica abrasive and L-arginine).

Example 5

Six polishing compositions were evaluated on the Logitech desktop polisher to evaluate the effects of 1,2,4 triazole and potassium bicarbonate. The control composition was identical to the Example 1 control. Composition 1B was identical to the Example 1 composition 1B. Compositions 5A and 5B included different 1,2,4 triazole concentrations but were otherwise identical to composition 1B. Composition 5A included 0.16 wt. % 1,2,4 triazole while composition 5B was triazole-free (0.0 wt. % 1,2,4 triazole). Compositions 5C and 5D included different KHCO₃ concentrations but were otherwise identical to composition 1B. Composition 5C included 0.655 wt. % KHCO₃ while composition 5D was potassium bicarbonate free (0.0 wt. % KHCO₃).

Blanket polysilicon, TEOS wafers, and SiN wafers were polished for 60 seconds on a Logitech desktop polisher using a D100 pad at the conditions listed above. Polishing results are shown in Table 5. All removal rates (RR) are listed in angstroms per minute (Å/min).

TABLE 5

|  | PolySi RR | TEOS RR | SiN RR | PolySi:TEOS | PolySi:SiN |
| --- | --- | --- | --- | --- | --- |
| Control | 4409 | 105 | 56 | 42 | 79 |
| 1B | 4126 | 13 | 15 | 317 | 275 |
| 5A | 4287 | 28 | 10 | 153 | 429 |
| 5B | 4312 | 19 | 12 | 227 | 359 |
| 5C | 4127 | 29 | 12 | 142 | 344 |
| 5D | 3650 | 31 | 11 | 118 | 332 |

As is evident from the data set forth in Table 5, 1,2,4-triazole had essentially no influence on the polysilicon, TEOS, and SiN removal rates. The polysilicon removal rate decreased by about 10% without KHCO₃. Halving the KHCO₃ concentration had no influence on the polysilicon, TEOS, and SiN removal rates.

Example 6

Five polishing compositions were evaluated on the Logitech desktop polisher to evaluate the effect of alternative potassium salts. Composition 4B was identical to composition 4B in Example 4. Compositions 6A, 6B, 6C, and 6D were identical to composition 4B in Example 4 with the exception that (i) composition 6A included an equal molar quantity of KCl in place of the KHCO₃, (ii) composition 6B included twice the molar quantity of KCl in place of the KHCO₃, (iii) composition 6C included an equal molar quantity of KBr in place of the KHCO₃, and (iv) composition 6D included an equal molar quantity of KI in place of the KHCO₃. The electrical conductivities of the point of use compositions were 3.55 mS/cm (4B), 2.34 mS/cm (6A), 3.35 mS/cm (6B).

Blanket polysilicon, TEOS wafers, and SiN wafers were polished for 60 seconds on a Logitech desktop polisher using an IC1010 pad at the conditions listed above. Polishing results are shown in Table 6. All removal rates (RR) are listed in angstroms per minute (Å/min).

TABLE 6

|  | PolySi RR | TEOS RR | SiN RR | PolySi:TEOS | PolySi:SiN |
| --- | --- | --- | --- | --- | --- |
| 6A | 3793 | 88 | 29 | 43 | 131 |
| 6B | 4008 | 99 | 24 | 40 | 167 |
| 6C | 3867 | 50 | 31 | 77 | 125 |
| 6D | 4121 | 34 | 24 | 121 | 172 |
| 6E | 4029 | 42 | 26 | 96 | 155 |

As is evident from the data set forth in Table 6, the polysilicon removal rate is not strongly influenced by the choice potassium salt or conductivity.

Example 7

Three polishing compositions were evaluated on the Logitech desktop polisher to evaluate the effect of pH on polysilicon removal rate. Compositions 7A, 7B, and 7C were identical to composition 4A from Example 4 with the exception that the quantity of KOH was adjusted such that the pH of the point of use compositions were 10.0 (7A), 10.5 (7B), and 11.0 (7C).

Blanket polysilicon wafers were polished for 60 seconds on a Logitech desktop polisher using a D100 pad at the conditions listed above. Polishing results are shown in Table 7. Removal rates (RR) are listed in angstroms per minute (Å/min).

TABLE 7

|  | PolySi RR |
| --- | --- |
| 7A | 3182 |
| 7B | 4247 |
| 7C | 3872 |

As is evident from the data set forth in Table 7, the polysilicon removal rates are high at pH values of 10.0, 10.5, and 11.0. The polysilicon removal rate is highest at pH 10.5.

Example 8

Eight polishing compositions were evaluated on the Logitech desktop polisher. Compositions 8A and 8B were identical to compositions 5B and 1B in corresponding Examples 5 and 1 with the exception that they were prepared as 7.5× concentrates and therefore included (i) 6.56 wt. % silica (Nalco DVSTS006 silica particles), (ii) 1.26 wt. % L-arginine, (iii) 0.65 wt. % KHCO$_3$, (d) 0.39 wt. % KOH, (e) 0.19 wt. % aminotri(methylene phosphonic acid) (DEQUEST® 2000EG, and (f) 0.165 wt. % 1,2,4-triazole (8A) or 0.0 wt. % 1,2,4-triazole (8B) in deionized water. Compositions 8C, 8E, and 8G were identical to composition 8A with the exception that they included alternative colloidal silicas. Compositions 8D, 8E, and 8H were identical to composition 8B with the exception that they included alternative colloidal silicas. Compositions 8C and 8D included Fuso PL-3 colloidal silica. Compositions 8E and 8F included Fuso PL-5 colloidal silica. Compositions 8G and 8H included Fuso PL-7 colloidal silica. One part of each of compositions 8A, 8B, 8C, 8D, 8E, 8F, 8G, and 8H was mixed with 6.5 parts deionized water to obtain the point of use polishing compositions.

Blanket polysilicon, TEOS wafers, and SiN wafers were polished for 60 seconds on a Logitech desktop polisher using an IC1010 pad at the conditions listed above. Polishing results are shown in Table 8. All removal rates (RR) are listed in angstroms per minute (Å/min)

TABLE 8

|    | PolySi RR | TEOS RR | SiN RR | PolySi:TEOS | PolySi:SiN |
|----|-----------|---------|--------|-------------|------------|
| 8A | 2874 | 17 | 10 | 169 | 287 |
| 8B | 2948 | 24 | 22 | 123 | 134 |
| 8C | 3311 | 39 | 33 | 85 | 100 |
| 8D | 3336 | 21 | 16 | 159 | 209 |
| 8E | 3172 | 36 | 21 | 88 | 151 |
| 8F | 3213 | 38 | 18 | 85 | 179 |
| 8G | 3128 | 43 | 26 | 73 | 120 |
| 8H | 3342 | 33 | 25 | 101 | 134 |

It is readily apparent from the polysilicon polishing rate is not strongly influenced by silica particle size over a range from about 65 nm to about 120 nm.

Example 9

Six polishing compositions were evaluated on the Mirra® polishing tool to confirm certain observations made using the Logitech desktop polisher. The control composition was identical to the Example 1 control. Compositions 9A and 9B were identical to compositions 1A and 1B in Example 1 with the exception that they were prepared as 10× concentrates and therefore included (i) 8.75 wt. % silica (Nalco DVSTS006 silica particles), (ii) 3.35 wt. % L-arginine (9A) or 1.67 wt. % L-arginine (9B), (iii) 0.87 wt. % KHCO$_3$, (d) 0.53 wt. % KOH, (e) 0.26 wt. % aminotri(methylene phosphonic acid) (DEQUEST® 2000EG, and (f) 0.22 wt. % 1,2,4-triazole in deionized water. Composition 9C was identical to composition 9A with the exception that it included 5.83 wt. % silica in the concentrate (a one-third reduction from composition 9A). Composition 9D was identical to composition 9A in Example 1 with the exception that it was triazole-free (0.0 wt. % 1,2,4 triazole). Composition 9E was identical to composition 9C with the exception that it was triazole-free (0.0 wt. % 1,2,4 triazole).

Blanket polysilicon, TEOS wafers, and SiN wafers were polished for 60 seconds on a Logitech desktop polisher using an IC1010 pad at the conditions listed above. Polishing results are shown in Table 9. All removal rates (RR) are listed in angstroms per minute (Å/min).

TABLE 9

|         | PolySi RR | TEOS RR | SiN RR | PolySi:TEOS | PolySi:SiN |
|---------|-----------|---------|--------|-------------|------------|
| Control | 5444 | 36 | 68 | 151 | 80 |
| 9A | 4858 | 21 | 23 | 231 | 211 |
| 9B | 4667 | 20 | 23 | 233 | 203 |
| 9C | 4945 | 14 | 13 | 353 | 380 |
| 9D | 4732 | 20 | 22 | 237 | 215 |
| 9E | 4770 | 13 | 13 | 367 | 367 |

As is evident from the data set forth in table 9, each of the compositions achieved high polysilicon removal rates. The compositions included reduced silica (one third reduction) silica concentrations achieved higher removal rate selectivities to both TEOS and SiN.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:
1. A chemical mechanical polishing composition for polishing a substrate containing a polysilicon layer, the composition comprising:
   a water based liquid carrier;
   about 0.1 to about 3 weight percent silica abrasive particles dispersed in the liquid carrier;
   about 0.05 to about 1 weight percent of a polysilicon accelerator, wherein the polysilicon accelerator is arginine, trimethylglycine, guanidine carbonate, or a mixture thereof;
   an alkali metal salt;

wherein the composition further comprising about 0.01 to about 1 weight percent of a potassium salt and further comprising about 0.01 to about 0.5 weight percent of a heterocyclic amine;

wherein the composition has a pH in a range from about 10 to about 11, wherein the composition further comprises about 0.05 to about 0.5 weight percent of an amino phosphonic acid compound; and wherein the composition comprises less than about 500 ppm by weight tetraalkylammonium salts, and wherein the composition further comprises about 0.03 to about 0.3 weight percent of potassium bicarbonate.

2. The composition of claim 1, comprising from about 0.2 to about 1.5 weight percent of the silica abrasive particles.

3. The composition of claim 1, comprising from about 0.1 to about 0.5 weight percent of the polysilicon accelerator.

4. The composition of claim 1, wherein the polysilicon accelerator is a guanidine derivative.

5. The composition of claim 1, wherein the heterocyclic amine is a triazole compound.

6. The composition of claim 1, wherein the amino phosphonic acid compound is amino trimethylene phosphonic acid.

7. The composition of claim 1 further comprising:
from about 0.03 to about 0.3 weight percent of potassium bicarbonate; and
wherein the polysilicon accelerator is arginine, and wherein the amino phosphonic acid compound is amino trimethylene phosphonic acid.

8. The composition of claim 1, wherein the composition comprises less than about 10 ppm tetraalkylammonium salts.

* * * * *